United States Patent
Cho et al.

(10) Patent No.: US 7,864,574 B2
(45) Date of Patent: Jan. 4, 2011

(54) MEMORY DEVICE AND MEMORY PROGRAMMING METHOD

(75) Inventors: Kyoung Lae Cho, Yongin-si (KR); Yong June Kim, Seoul (KR); Seung-Hwan Song, Suwon-si (KR); Jun Jin Kong, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 55 days.

(21) Appl. No.: 12/453,108

(22) Filed: Apr. 29, 2009

(65) Prior Publication Data

US 2009/0285023 A1     Nov. 19, 2009

(30) Foreign Application Priority Data

May 13, 2008    (KR) .................. 10-2008-0044146

(51) Int. Cl.
    G11C 11/34    (2006.01)
(52) U.S. Cl. .................. 365/185.03; 365/185.24
(58) Field of Classification Search ........... 365/185.03, 365/185.24
    See application file for complete search history.

(56) References Cited

U.S. PATENT DOCUMENTS

| 6,233,717 | B1 | 5/2001 | Choi | |
| 7,206,224 | B1 * | 4/2007 | Randolph et al. | 365/185.03 |
| 7,298,648 | B2 * | 11/2007 | Lee et al. | 365/185.03 |
| 7,301,806 | B2 * | 11/2007 | Tanaka | 365/185.03 |
| 7,349,249 | B2 * | 3/2008 | Honma et al. | 365/185.03 |
| 7,405,970 | B2 * | 7/2008 | Tanaka et al. | 365/185.03 |
| 2003/0189856 | A1 | 10/2003 | Cho et al. | |
| 2006/0268654 | A1 | 11/2006 | Chae et al. | |

FOREIGN PATENT DOCUMENTS

| EP | 1 028 433 A1 | 8/2000 |
| JP | 2003-067260 | 3/2003 |
| JP | 2006-146406 | 6/2006 |
| KR | 10-2007-0115755 | 12/2007 |
| KR | 10-2008-0012199 | 2/2008 |

OTHER PUBLICATIONS

International Search Report dated Apr. 30, 2010 for corresponding PCT Application No. PCT/KR2009/002487.

* cited by examiner

*Primary Examiner*—Michael T Tran
(74) *Attorney, Agent, or Firm*—Harness, Dickey & Pierce, P.L.C.

(57) ABSTRACT

Provided are memory devices and memory programming methods. A memory device may include a multi-bit cell array including a plurality of multi-bit cells, a programming unit configured to program a first data page in the plurality of multi-bit cells and to program a second data page in the multi-bit cells with the programmed first data page, a first controller configured to divide the multi-bit cells with the programmed first data page into a first group and a second group, and a second controller configured to set a target threshold voltage interval of each of the multi-bit cells included in the first group based on first read voltage levels and the second data page, and to set a target threshold voltage interval of each of the multi-bit cells included in the second group based on second read threshold voltage levels and the second data page.

21 Claims, 7 Drawing Sheets

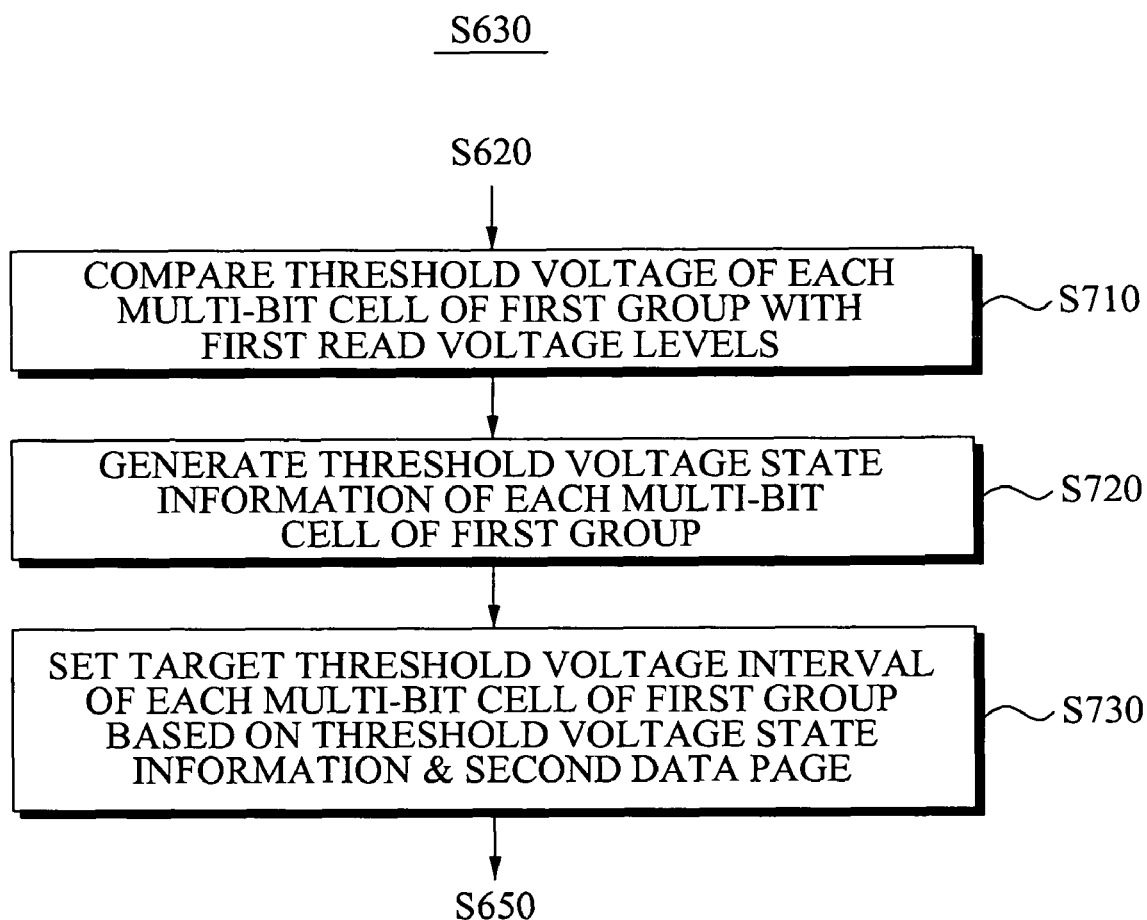

MEMORY DEVICE AND MEMORY PROGRAMMING METHOD

PRIORITY STATEMENT

This application claims priority under 35 U.S.C. §119 to Korean Patent Application No. 10-2008-0044146, filed on May 13, 2008, in the Korean Intellectual Property Office (KIPO), the entire contents of which are incorporated herein by reference.

BACKGROUND

1. Field

Example embodiments relate to apparatuses and/or methods that may program data. Also, example embodiments relate to apparatuses and/or methods that may program data in multi-level cell memory devices or multi-bit cell memory devices.

2. Description of Related Art

A single-level cell (SLC) memory device may store one bit of data in a single memory cell. The SLC memory may be referred to as a single-bit cell (SBC) memory. A process of storing one bit of data in a single level cell of the SLC memory device may be referred to as a programming process and may change a threshold voltage of the single level cell. For example, when data of logic value "1" is stored in a single level cell, the single level cell may have a threshold voltage of 1.0 V. When data of logic value "0" is stored in the single level cell, the single level cell may have a threshold voltage of 3.0 V.

Due to a minute electrical characteristic difference between single level cells, the threshold voltage formed in each of the single level cells with the same data programmed may have a distribution within a predetermined range. For example, when a voltage read from a memory cell is greater than 0.5V and less than 1.5V, it may be determined that data stored in the memory cell has a logic value of "1". When the voltage read from the memory cell is greater than 2.5V and less than 3.5V, it may be determined that the data stored in the memory cell has a logic value of "0". The data stored in the memory cell may be classified depending on the difference between memory cell currents/voltages during the reading operations.

Meanwhile, a multi-bit cell (MLC) memory device that can store data of two or more bits in a single memory cell has been proposed in response to a need for higher integration of memory. The MLC memory device may also be referred to as a multi-bit cell (MBC) memory. However, as the number of bits stored in the single memory cell increases, reliability may deteriorate and the read-failure rate may increase. To program 'm' bits in a single memory cell, any one of $2^m$ threshold voltages may be required to be formed in the memory cell. Due to the minute electrical characteristic difference between memory cells, threshold voltages of memory cells with the same data programmed may form a distribution within a predetermined range. A single threshold voltage distribution may correspond to each of $2^m$ data values that can be generated according to 'm' bits.

In the case of the MLC memory device that can store information based on a page unit, in order to store information associated with an $m^{th}$ bit, it may be required to be aware of information associated with first to $(m-1)^{th}$ bits that are stored in the MLC memory device. If information associated with the first to the $(m-1)^{th}$ bits is stored, the MLC memory device may form one threshold voltage among $2^{(m-1)}$ threshold voltages and perform an internal read operation to be aware of a location of the threshold voltage. The internal read operation may denote a read operation that occurs while performing an MLC program. Therefore, if an error occurs in the internal read operation, it may be possible to misjudge information associated with the first to the $(m-1)^{th}$ bits and thereby move a threshold voltage of the MLC memory device to an undesired location when performing MLC programming. When stored information is read through a normal read operation after the MLC programming is completed, it may be possible to read erroneous information since the MLC memory device has an erroneous threshold voltage, causing an error.

Since the voltage window of a memory may be limited, the distance between $2^m$ distributions of threshold voltage between adjacent bits may decrease as 'm' increases, which may cause overlapping of the distributions. If the distributions are overlapped with each other, the read failure rate may increase.

SUMMARY

Example embodiments may provide apparatuses and/or methods that may reduce a programming error by applying a new state decision scheme to a multi-bit programming method.

According to example embodiments, an apparatus may include a memory device. The memory device may include a multi-bit cell array including a plurality of multi-bit cells, a programming unit configured to program a first data page in the plurality of multi-bit cells and to program a second data page in the multi-bit cells with the programmed first data page, a first controller configured to divide the multi-bit cells with the programmed first data page into a first group and a second group, and a second controller configured to set a target threshold voltage interval of each of the multi-bit cells included in the first group based on first read voltage levels and the second data page, and to set a target threshold voltage interval of each of the multi-bit cells included in the second group based on second read threshold voltage levels and the second data page.

According to example embodiments, a method may include a memory programming method. The memory programming method may include programming a first data page in a plurality of multi-bit cells, dividing the plurality of multi-bit cells into a first group and a second group, setting a target threshold voltage interval of each of the multi-bit cells included in the first group based on first read voltage levels and the a second data page, setting a target threshold voltage interval of each of the multi-bit cells included in the second group based on second read voltage levels and the second data page, and programming the second data page in the plurality of multi-bit cells.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 7 is a flowchart illustrating an example of setting a target threshold voltage interval shown in FIG. 6.

DETAILED DESCRIPTION OF EXAMPLE EMBODIMENTS

Figure 1:
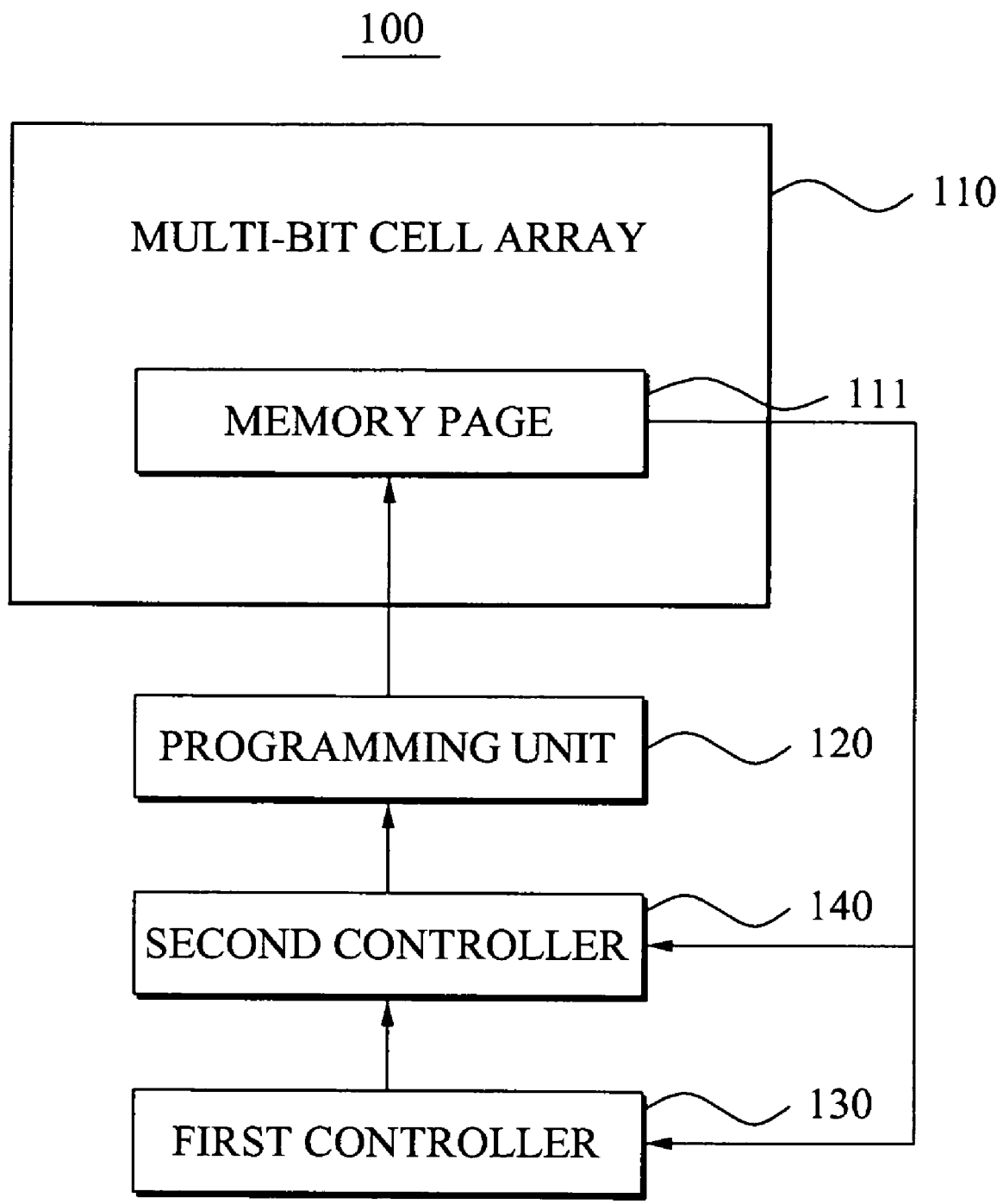
FIG. 1 is a block diagram of a memory device according to example embodiments.

Detailed example embodiments are disclosed herein. However, specific structural and functional details disclosed herein are merely representative for purposes of describing example embodiments. Example embodiments may, however, may be embodied in many alternate forms and should not be construed as being limited to only the embodiments set forth herein.

Accordingly, while example embodiments are capable of various modifications and alternate forms, embodiments thereof are shown by way of example in the drawings and will be described in detail. It should be understood, however, that there is not intent to limit example embodiments to the particular forms disclosed, but to the contrary, example embodiments are to cover all modifications, equivalents, and alternatives falling within the scope of the example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

Reference will now be made to example embodiments, which are illustrated in the accompanying drawings, wherein like reference numerals may refer to like components throughout.

FIG. 1 illustrates an example of a memory device 100 according to example embodiments.

Referring to FIG. 1, the memory device 100 includes a multi-bit cell array 110, a programming unit 120, a first controller 130, and a second controller 140.

The multi-bit cell array 110 may include a plurality of multi-bit cells.

The programming unit 120 may change a threshold voltage of each of the multi-bit cells to thereby program data in each of the multi-bit cells. If the multi-bit cell stores m-bit data, the threshold voltage of the multi-bit cell may be any one of $2^m$ threshold voltages. The second controller 140 may set a target threshold voltage interval corresponding to data to be stored in the multi-bit cell. The programming unit 120 may apply a program condition voltage to the multi-bit cell until the threshold voltage of the multi-bit cell is included in the set target threshold voltage interval.

According to example embodiments, the second controller 140 may set $2^m$ target threshold voltage intervals corresponding to m-bit data and select any one from the set target threshold voltage intervals based on the data to be stored in the multi-bit cell. The programming unit 120 may apply a program condition voltage to the multi-bit cell until the threshold voltage of the multi-bit cell is included in the selected target threshold voltage interval.

According to example embodiments, the second controller 140 may set $2^m$ verify voltage levels corresponding to m-bit data and select any one from the set verify voltage levels based on the data to be stored in the multi-bit cell. The programming unit 120 may apply a program condition voltage to the multi-bit cell until the threshold voltage of the multi-bit cell is greater than or equal to the selected verify voltage level.

A process of programming, by the programming unit 120, data in a multi-bit cell may require a relatively longer time than a process of reading, by the memory device 100, the data stored in the multi-bit cell. In order to reduce a total programming time, the programming unit 120 may simultaneously program data in the plurality of multi-bit cells. In this instance, the second controller 140 may set a target threshold voltage interval in each of the simultaneously programmed multi-bit cells. The programming unit 120 may apply the program condition voltage to each of the multi-bit cells until the threshold voltage of each of the multi-bit cells is included in the set target threshold voltage interval.

Herein, a set of the simultaneously programmed multi-bit cells may be referred to as a "page". A memory page 111 may be a set of multi-bit cells that are simultaneously programmed by the programming unit 120. When each of the multi-bit cells included in the memory page 111 may store m-bit data, the memory page 111 may store m data pages.

According to example embodiments, the programming unit 120 may perform a first page programming operation to thereby program a most significant bit (MSB) in the multi-bit cells of the memory page 111. In this instance, a set of MSBs programmed in the multi-bit cells of the memory page 111 may be referred to as a first data page.

The programming unit 120 may perform a second page programming operation to thereby program a second bit in the multi-bit cells of the memory page 111. In this instance, a set of second bits programmed in the multi-bit cells of the memory page 111 may be referred to as a second data page.

The programming unit 120 may perform an $m^{th}$ page programming operation to thereby program a least significant bit (LSB) in the multi-bit cells of the memory page 111. In this instance, a set of LSBs programmed in the multi-bit cells of the memory page 111 may be referred to as an $m^{th}$ data page.

The first controller 130 may divide, into a first group and a second group, the multi-bit cells of the memory page 111 with the first data page programmed by the programming unit 120.

The second controller 140 may set a target threshold voltage interval of each of the multi-bit cells included in the first group, based on first read voltage levels and the second data page.

The second controller 140 may compare the threshold voltage of each of the multi-bit cells of the first group with the first read voltage levels to identify a threshold voltage state of each of the multi-bit cells of the first group. The second controller 140 may set the target threshold voltage interval of each of the multi-bit cells of the first group based on the identified threshold voltage state and the second data page to be programmed in each of the multi-bit cells of the first group.

In addition, the second controller 140 may set the target threshold voltage interval of each of the multi-bit cells of the second group based on second read voltage levels and the second data page.

The second controller 140 may compare a threshold voltage of each of the multi-bit cells of the second group with the second read voltage levels to identify a threshold voltage state of each of the multi-bit cells of the second group. The second controller 140 may set the target threshold voltage interval of each of the multi-bit cells of the second group based on the identified threshold voltage state and the second data page to be programmed in each of the multi-bit cells of the second group.

After the first data page is programmed in each of the multi-bit cells of the memory page 111, the second controller 140 may identify the threshold voltage state of each of the multi-bit cells of the first group based on the first read voltage levels and may also identify the threshold voltage state of each of the multi-bit cells of the second group based on the second read voltage levels.

The programming unit 120 may program the second data page in each of the multi-bit cells of the memory page 111 to adjust a threshold voltage of each of the multi-bit cells of the memory page 111 to be included in the target threshold voltage interval.

The first controller 130 may divide the multi-bit cells of the memory page 111 into the first group and the second group, based on additional information. For example, the additional information may include a location of each of the multi-bit cells, a programming order, a program/erase (P/E) cycle, whether of recharge, a number of recharges, time elapse, a change degree in a distribution width of a monitoring cell, and the like. The monitoring cell may be included in the multi-bit cell array 110. The memory device 100 may monitor a distribution of the threshold voltage of the monitoring cell to thereby estimate a change tendency of the threshold voltage.

The memory device 100 may identify the threshold voltage state using different read voltage levels with respect to the first group and the second group. The memory device 100 may identify the threshold voltage state using an optimal read voltage level based on characteristics of the multi-bit cell to thereby minimize or reduce an error that may occur while programming data.

Figure 2:
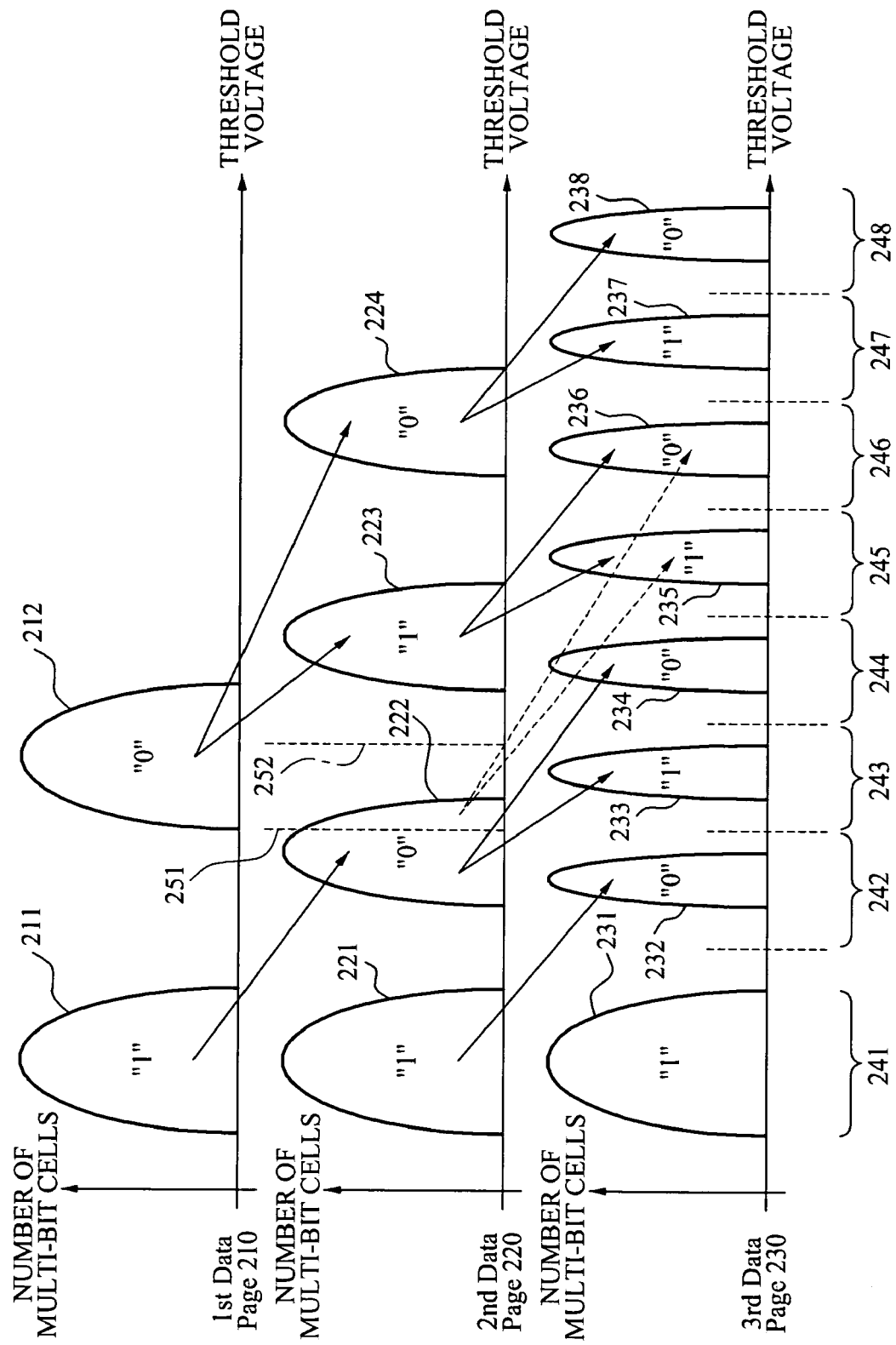
FIG. 2 illustrates an example of an operation of the memory device shown in FIG. 1.

FIG. 2 illustrates an example of an operation of the memory device 100 shown in FIG. 1.

Referring to FIG. 2, the horizontal axis denotes a threshold voltage and the vertical axis denotes a number of multi-bit cells corresponding to the threshold voltage.

After a first data page 210 is programmed, a threshold voltage of multi-bit cells of the multi-bit cell array 110 may correspond to a distribution 211 and a distribution 212.

According to example embodiments, the first data page 210 may correspond to an MSB. The MSB may be "1" or "0". A threshold voltage of multi-bit cells with the programmed MSB "1" may correspond to the distribution 211. A threshold voltage of multi-bit cells with the programmed MSB "0" may correspond to the distribution 212.

The programming unit 120 may perform a first page programming operation to form the distributions 211 and 212.

The memory device 100 may set any one voltage level between the distributions 211 and 212 to a read voltage level. The memory device 100 may decide whether the threshold voltage of multi-bit cells corresponds to the distribution 211 or the distribution 212 based on the set read voltage level.

The memory device 100 may set the target threshold voltage state of multi-bit cells based on the threshold voltage state of multi-bit cells and the second data page 220. According to example embodiments, the second data page 220 may correspond to a second bit.

For example, the memory device 100 may set, as a distribution 221, a target threshold voltage state of a multi-bit cell with second bit "1" to be programmed among the multi-bit cells corresponding to the distribution 211. The programming unit 120 may form the distribution 221 by applying a program condition voltage to the multi-bit cell with the second bit "1" to be programmed. The program condition voltage may inhibit a change in the threshold voltage state to be reduced or minimized. In this case, data programmed in the multi-bit cell corresponding to the distribution 221 may be "11".

The memory device 100 may set, as a distribution 222, a target threshold voltage state of a multi-bit cell with second bit "0" to be programmed among the multi-bit cells corresponding to the distribution 211. The programming unit 120 may form the distribution 222 by performing a second page programming operation with respect to the multi-bit cell with second bit "0" to be programmed. In this case, data programmed in the multi-bit cell corresponding to the distribution 222 may be "10".

The memory device 100 may set, as a distribution 223, a target threshold voltage state of a multi-bit cell with second bit "1" to be programmed among the multi-bit cells corresponding to the distribution 212. The programming unit 120 may perform the distribution 223 by performing the second page programming operation with respect to the multi-bit cell with second bit "1" to be programmed. In this case, data programmed in the multi-bit cell corresponding to the distribution 223 may be "01".

The memory device 100 may set, as a distribution 224, a target threshold voltage state of a multi-bit cell with second bit "0" to be programmed among the multi-bit cells corresponding to the distribution 212. The programming unit 120 may form the distribution 224 by performing the second page programming operation with respect to the multi-bit cell with second bit "0" to be programmed. In this case, data programmed in the multi-bit cell corresponding to the distribution 224 may be "00".

After the second data page 220 is programmed, the memory device 100 may set a voltage level between the distributions 221 and 222 as one of read voltage levels. Also, the memory device 100 may set a voltage level between the distributions 222 and 223 as one of read voltage levels. In addition, the memory device 100 may set a voltage level between the distributions 223 and 224 as one of read voltage levels.

The memory device 100 may identify a threshold voltage state of multi-bit cells after the second data page 220 is programmed, based on the three read voltage levels. The memory device 100 may set the target threshold voltage interval of multi-bit cells based on the identified threshold voltage state and a LSB. A third data page 230 may correspond to the LSB.

The memory device 100 may identify a threshold voltage state of multi-bit cells corresponding to the distribution 221 as a first threshold voltage state. The memory device 100 may set a target threshold voltage interval 241 with respect to a multi-bit cell with LSB "1" to be programmed among the multi-bit cells corresponding to the first threshold voltage state. The memory device 100 may set a target threshold voltage state 242 with respect to a multi-bit cell with LSB "0" to be programmed among the multi-bit cells corresponding to the first threshold voltage state.

The memory device 100 may identify a threshold voltage state of multi-bit cells corresponding to the distribution 222 as a second threshold voltage state. The memory device 100 may set a target threshold voltage state 243 with respect to a multi-bit cell with LSB "1" to be programmed among the multi-bit cells corresponding to the second threshold voltage state. The memory device 100 may set a threshold voltage 244 with respect to a multi-bit cell with LSB "0" to be programmed among the multi-bit cells corresponding to the second threshold voltage state.

The memory device 100 may identify a threshold voltage state of multi-bit cells corresponding to the distribution 223 as a third threshold voltage state. The memory device 100 may set a target threshold voltage state 245 with respect to a multi-bit cell with LSB "1" to be programmed among the multi-bit cells corresponding to the third threshold voltage state. The memory device 100 may set a target threshold voltage interval 246 with respect to a multi-bit cell with LSB "0" to be programmed among the multi-bit cells corresponding to the third threshold voltage state.

The memory device 100 may identify a threshold voltage state of multi-bit cells corresponding to the distribution 224 as a fourth threshold voltage state. The memory device 100 may set a target threshold voltage interval 247 with respect to a multi-bit cell with LSB "1" to be programmed among the multi-bit cells corresponding to the fourth threshold voltage state. The memory device 100 may set a target threshold voltage interval 248 with respect to a multi-bit cell with LSB "0" to be programmed among the multi-bit cells corresponding to the fourth threshold voltage state.

A voltage level 252 is an example of an appropriately selected read voltage level. The memory device 100 may determine whether a threshold voltage of a multi-bit cell is above or below the voltage level 252. When the threshold voltage of the multi-bit cell is greater than the voltage level 252, the memory device 100 may decide the multi-bit cell is included in the third threshold voltage state or the fourth threshold voltage state. Conversely, when the threshold voltage of the multi-bit cell is less than the voltage level 252, the memory device 100 may decide the multi-bit cell is included in the first threshold voltage state or the second threshold voltage state.

The programming unit 120 may form a distribution 231 by applying a program condition voltage, inhibiting a change in the threshold voltage to be reduced or minimized, to multi-bit cells corresponding to the target threshold voltage interval 241. Multi-bit cells corresponding to the distribution 231 may store data "111".

The programming unit 120 may form a distribution 232 by performing a third page programming operation with respect to multi-bit cells corresponding to the target threshold voltage interval 242. Multi-bit cells corresponding to the distribution 232 may store data "110".

The programming unit 120 may form a distribution 233 by performing the third page programming operation with respect to multi-bit cells corresponding to the target threshold voltage interval 243. Multi-bit cells corresponding to the distribution 233 may store data "101".

The programming unit 120 may form a distribution 234 by performing the third page programming operation with respect to multi-bit cells corresponding to the target threshold voltage interval 244. Multi-bit cells corresponding to the distribution 234 may store data "100".

The programming unit 120 may form a distribution 235 by performing the third page programming operation with respect to multi-bit cells corresponding to the target threshold voltage interval 245. Multi-bit cells corresponding to the distribution 235 may store data "011".

The programming unit 120 may form a distribution 236 by performing the third page programming operation with respect to multi-bit cells corresponding to the target threshold voltage interval 246. Multi-bit cells corresponding to the distribution 236 may store data "010".

The programming unit 120 may form a distribution 237 by performing the third page programming operation with respect to multi-bit cells corresponding to the target threshold voltage interval 247. Multi-bit cells corresponding to the distribution 237 may store data "001".

The programming unit 120 may form a distribution 238 by performing the third page programming operation with respect to multi-bit cells corresponding to the target threshold voltage interval 248. Multi-bit cells corresponding to the distribution 238 may store data "000".

A voltage level 251 is an example of an erroneously selected read voltage level. The memory device 100 may determine whether a threshold voltage of a multi-bit cell is above or below the voltage level 251. The memory device 100 may identify, as the third threshold voltage state, a state of a multi-bit cell with a threshold voltage greater than the voltage level 251 among multi-bit cells corresponding to the distribution 222. Since the memory device 100 sets the target threshold voltage state 245 with respect to multi-bit cells with LSB "1" to be programmed among multi-bit cells corresponding to the third threshold voltage state, the multi-bit cells with the threshold voltage greater than the voltage level 251 among the multi-bit cells corresponding to the distribution 222, may form the distribution 235. In this instance, a multi-bit cell corresponding to the distribution 235 may be regarded as storing data "011". In this case, some of the multi-bit cells corresponding to the distribution 235 formed the distribution 222 and thus data that should have been stored in the multi-bit cells may be "101", but currently stored data may actually be "011". The memory device 100 may select the voltage level as the erroneously read voltage level to thereby cause an error in a MSB and a second bit during the third page programming operation.

Herein, an operation of performing, by the memory device 100, a threshold voltage state identifying operation between page programming operations may be referred to as an "internal read operation". In the internal read operation, the memory device 100 may perform the internal read operation using an optimal read voltage level based on characteristics of a multi-bit cell and thereby reducing or minimizing an error that may occur during a programming operation.

The memory device 100 may determine an optimal read voltage with respect to each of the multi-bit cells based on additional information and may perform the internal read operation with respect thereto using the determined read voltage level. For example, as described above, the additional information may include a location of each of the multi-bit cells, a P/E cycle, a programming order, whether of recharge, a number of recharges, time elapse, a change degree in a distribution width of a monitoring cell, and the like.

Figure 3:
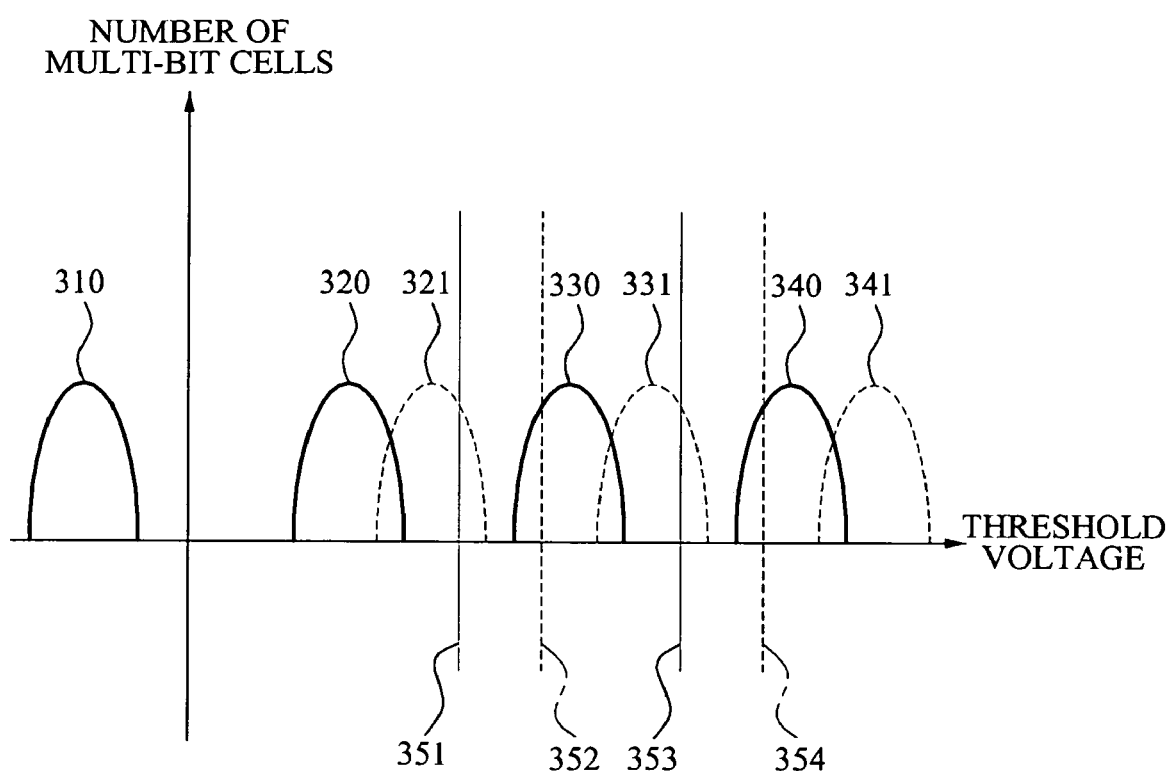
FIG. 3 illustrates another example of an operation of the memory device shown in FIG. 1.

FIG. 3 illustrates another example of an operation of the memory device 100 shown in FIG. 1.

Referring to FIG. 3, the horizontal axis denotes a threshold voltage and the vertical axis denotes a number of multi-bit cells corresponding to the threshold voltage.

After a first data page is programmed, multi-bit cells corresponding to a distribution 310 may store data "11"

After the first data page is programmed, the first controller 130 may select, as a first group, multi-bit cells corresponding to distributions 320, 330, and 340. The first controller 130 may select, as a second group, multi-bit cells corresponding to distributions 321, 331, and 341.

With respect to the multi-bit cells selected as the first group, the second controller 140 may set voltage levels 351 and 353 as read voltage levels. With respect to the multi-bit cells selected as the second group, the second controller 140 may set voltage levels 352 and 354 as read voltage levels.

The second controller 140 may perform an internal read operation with respect to the multi-bit cells selected as the first group, using the voltage levels 351 and 353. The second controller 140 may identify, as a first threshold voltage state, a threshold voltage state of multi-bit cells corresponding to the distribution 320 from the multi-bit cells selected as the first group, based on a result of the internal read operation. The second controller 140 may identify, as a second threshold voltage state, a threshold voltage state of multi-bit cells corresponding to the distribution 330 from the multi-bit cells selected as the first group, based on the result of the internal read operation. The second controller 140 may identify, as a third threshold voltage state, a threshold voltage state of multi-bit cells corresponding to the distribution 340 from the multi-bit cells selected as the first group, based on the result of the internal read operation.

The second controller 140 may perform the internal read operation with respect to the multi-bit cells selected as the second group, using the voltage levels 352 and 354. The second controller 140 may identify, as the first threshold voltage state, a threshold voltage state of multi-bit cells corresponding to the distribution 321 from the multi-bit cells selected as the second group, based on the result of the internal read operation. The second controller 140 may identify, as the second threshold voltage state, a threshold voltage state of multi-bit cells corresponding to the distribution 331 from the multi-bit cells selected as the second group, based on the result of the internal read operation. The second controller 140 may identify, as the third threshold voltage state, a threshold voltage state of multi-bit cells corresponding to the distribution 341 from the multi-bit cells selected as the second group, based on the result of the internal read operation.

According to example embodiments, among multi-bit cells with a programmed first data page, the first controller 130 may set, as the first group, multi-bit cells connected to a first word line and set, as the second group, multi-bit cells connected to a second word line. The memory page 111 may be a set of multi-bit cells connected to a single word line. Characteristics of multi-bit cells connected to a different word line may be different and thus the memory device 100 may determine a read voltage level of the internal read operation according to a word line connected with the multi-bit cells.

According to example embodiments, among multi-bit cells with the programmed first data page, the first controller 130 may set, as the first group, multi-bit cells connected to an even bit line and set, as the second group, multi-bit cells connected to an odd bit line. Characteristics of the multi-bit cells connected to the even bit line may be different from characteristics of the multi-bit cells connected to the odd bit line. Therefore, the memory device 100 may determine the read voltage level of the internal read operation according to a bit line connected with multi-bit cells.

According to example embodiments, among multi-bit cells with the programmed first data page, the first controller 130 may set, as the first group, multi-bit cells with a P/E cycle less than a reference value and set, as the second group, multi-bit cells with the P/E cycle greater than or equal to the reference value. The P/E cycle may denote a number of cycles where a multi-bit cell is programmed and is erased. As the P/E cycle of the multi-bit cell increases, charge retention of the multi-bit cell may degrade. The memory device 100 may determine the read voltage level of the internal read operation according to the P/E cycle of the multi-bit cell. For example, the memory device 100 may select, as the first group, a multi-bit cell with the P/E cycle less than or equal to 100 and select, as the second group, a multi-bit cell with the P/E cycle greater than 100.

According to example embodiments, among multi-bit cells with the programmed first data page, the first controller 130 may set, as the first group, multi-bit cells with the first data page programmed in a first time slot and set, as the second group, multi-bit cells with the first data page programmed in a second time slot. The memory device 100 may determine the read voltage level of the internal read operation according to a programmed order of the multi-bit cells.

The multi-bit cells with the first data page programmed in the first time slot may receive undesired affect by a programming operation that is performed in the second time slot. For example, mechanisms of affecting a programmed multi-bit cell prior to the programming operation may be program disturbance, floating gate (FG) coupling, and the like.

According to example embodiments, the programming unit 120 may apply a program voltage to a gate terminal of each of the multi-bit cells to thereby program the first data page. In this instance, among the multi-bit cells with the programmed first data page, the first controller 130 may set, as the first group, multi-bit cells with a distance from the programming unit 120 less than a reference value and set, as the second group, multi-bit cells with the distance from the programming unit 120 greater than or equal to the reference value. The memory device 100 may determine the read voltage level of the internal read operation according to the distance from the programming unit 120. Due to a parasitic resistance and a parasitic capacitance of a word line or a bit line, as a path for applying the program voltage is longer, a different voltage level may be applied.

According to example embodiments, the first controller 130 may store an error rate of each of the multi-bit cells with the programmed first data page. Among the multi-bit cells with the programmed first data page, the first controller 130 may set, as the first group, multi-bit cells with the stored error rate less than a reference value and set, as the second group, multi-bit cells with the stored error rate greater than or equal to the reference value. The memory device 100 may determine the read voltage level of the internal read operation of each of the multi-bit cells with the programmed first data page, based on the error rate of each of the multi-bit cells with the programmed first data page.

According to example embodiments, the first controller 130 may store a number of recharges of each of the multi-bit cells with the programmed first data page. Among the multi-bit cells with the programmed first data page, the first controller 130 may set, as the first group, multi-bit cells with the stored number of recharges less than a reference value and set, as the second group, multi-bit cells with the stored number of recharges greater than or equal to the reference value. The memory device 100 may determine the read voltage level of the internal read operation of each of the multi-bit cells with the programmed first data page, based on the number of recharges of each of the multi-bit cells with the programmed first data page.

Figure 4:
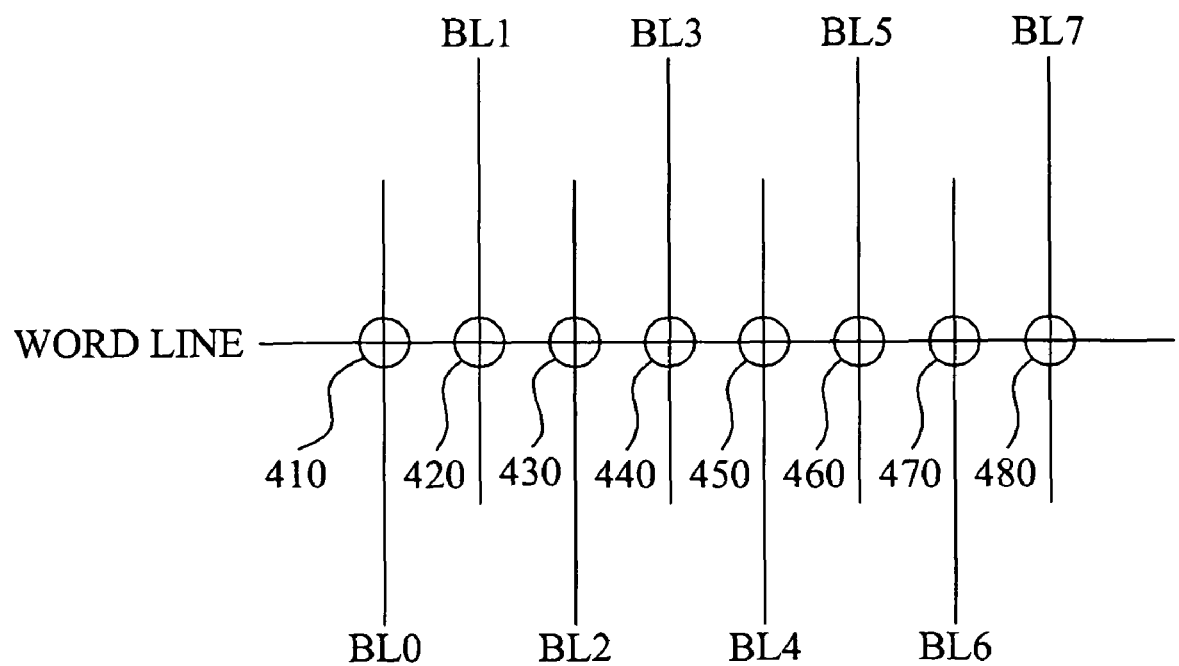
FIG. 4 illustrates still another example of an operation of the memory device shown in FIG. 1.

FIG. 4 illustrates still another example of an operation of the memory device 100 shown in FIG. 1.

Referring to FIG. 4, the memory device 100 may divide, into a first group and a second group, eight multi-bit cells 410, 420, 430, 440, 450, 460, 470, and 480 connected to a single word line.

The multi-bit cell 410 is connected to the word line and a bit line BL0. The multi-bit cell 420 is connected to the word line and a bit line BL1. The multi-bit cell 430 is connected to the word line and a bit line BL2. The multi-bit cell 440 is connected to the word line and a bit line BL3.

The multi-bit cell 450 is connected to the word line and a bit line BL4. The multi-bit cell 460 is connected to the word lie and a bit line BL5. The multi-bit cell 470 is connected to the word line and a bit line BL6. The multi-bit cell 480 is connected to the word line and a bit line BL7.

The memory device 100 may select, as the first group, the multi-bit cells 410, 430, 450, and 470 connected to even bit lines BL0, BL2, BL4, and BL6. The memory device 100 may select, as the second group, the multi-bit cells 420, 440, 460, and 480 connected to odd bit lines BL1, BL3, BL5, and BL7.

Figure 5:
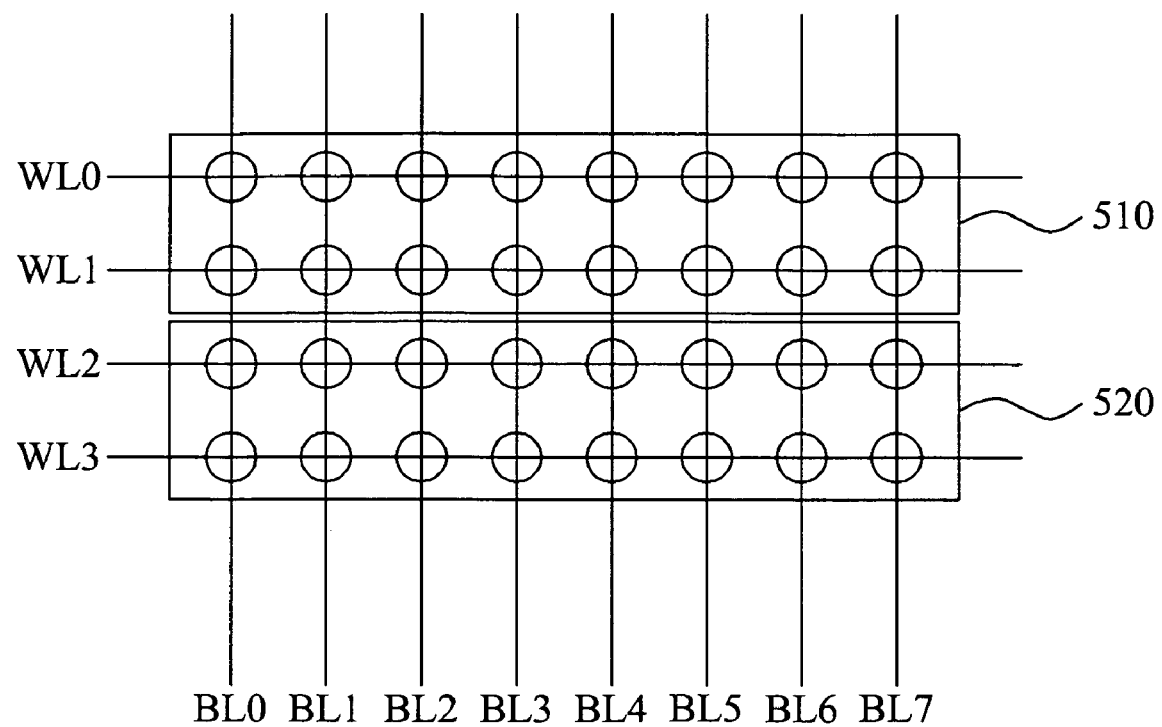
FIG. 5 illustrates yet another example of an operation of the memory device shown in FIG. 1.

FIG. 5 illustrates yet another example of an operation of the memory device 100 shown in FIG. 1.

Referring to FIG. 5, the memory device 100 may divide, into a first group and a second group, 32 multi-bit cells connected to four word lines WL0, WL1, WL2, and WL3, and eight bit lines BL0, BL1, BL2, BL3, BL4, BL5, BL6, and BL7.

Regardless of the bit lines, the memory device 100 may select, as the first group, multi-bit cells connected to the word lines WL0 and WL1 and select, as the second group, multi-bit cells connected to the word lines WL2 and WL3.

Figure 6:
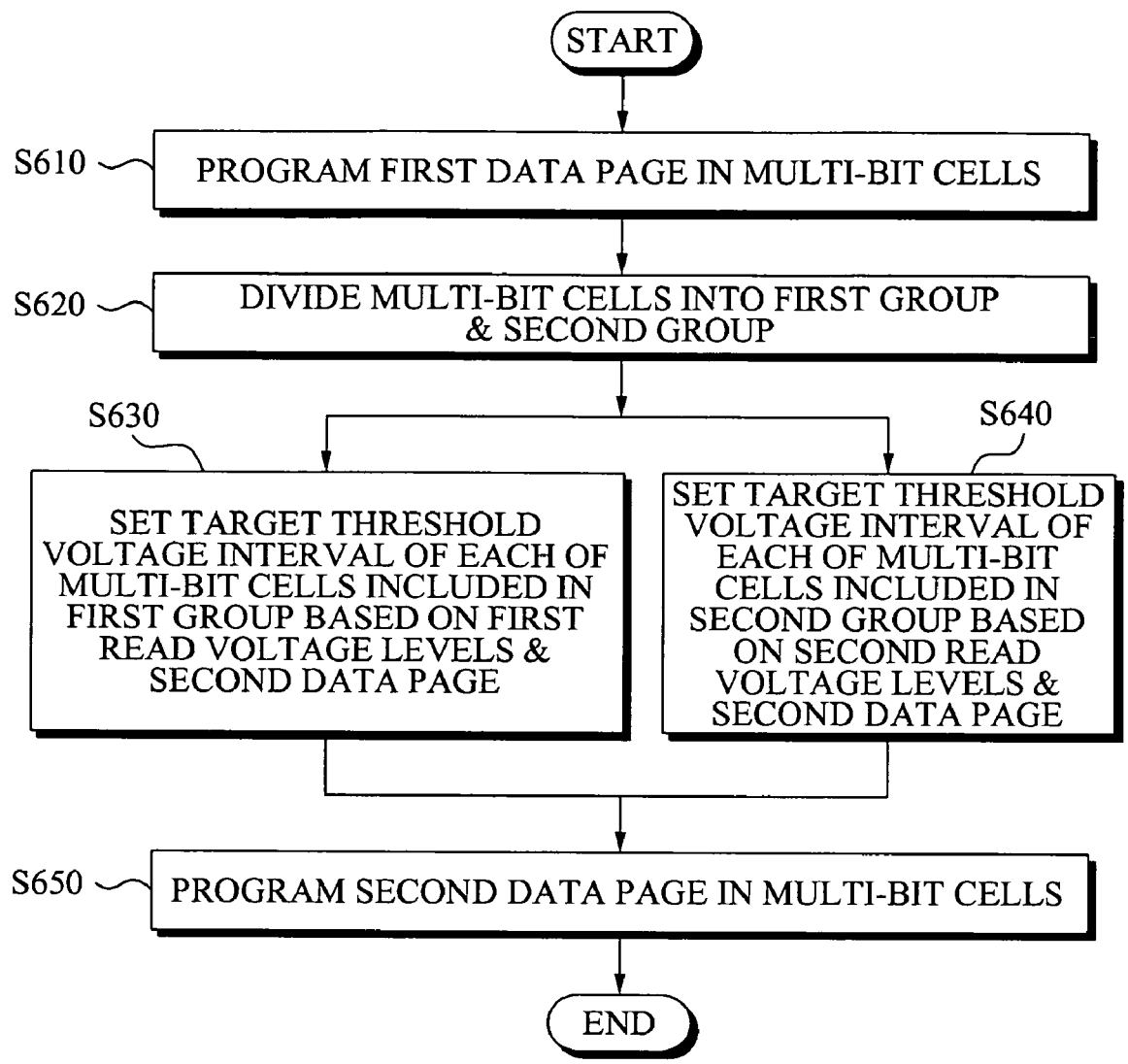
FIG. 6 is a flowchart illustrating an example of a memory programming method according to example embodiments.

FIG. 6 is a flowchart illustrating an example of a memory programming method according to example embodiments.

In operation S610, the memory programming method may program a first data page in a plurality of multi-bit cells.

In operation S620, the memory programming method may divide the plurality of multi-bit cells into a first group and a second group.

In operation S630, the memory programming method may set a target threshold voltage interval of each of the multi-bit cells included in the first group based on first read voltage levels and the second data page.

In operation S640, the memory programming method may set a target threshold voltage interval of each of the multi-bit cells included in the second group based on second read voltage levels and the second data page.

In operation S650, the memory programming method may program the second data page in the plurality of multi-bit cells.

FIG. 7 is a flowchart illustrating an example of operation S630 shown in FIG. 6.

In operation S710, the memory programming method may compare the threshold voltage of each of the multi-bit cells of the first group with the first read voltage levels.

In operation S720, the memory programming method may generate threshold voltage state information of each of the multi-bit cells of the first group.

In operation S730, the memory programming method may set the target threshold voltage interval of each of the multi-bit cells of the first group based on the threshold voltage state information and the second data page.

Example embodiments may be applicable to memory devices that change a threshold voltage of a memory cell to thereby store data, for example, a flash memory, an electrically erasable programmable read-only memory (EEPROM), a phase shift random access memory (PRAM), a magnetic random access memory (MRAM), and the like.

The memory programming method according to example embodiments may be recorded in computer-readable media including program instructions to implement various operations embodied by a computer. The media may also include, alone or in combination with the program instructions, data files, data structures, and/or the like. The media and program instructions may be those especially designed and constructed for the purposes of example embodiments, or they may be of the kind well-known and available to those having skill in the computer software arts. Examples of computer-readable media include magnetic media such as hard disks, floppy disks, and magnetic tape; optical media such as CD ROM disks and DVD; magneto-optical media such as optical disks; and hardware devices that are especially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages such as Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In example embodiments, the memory controllers may be constructed to communicate with an external device for example, a host using any one of various types of protocols such as a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices such as a cellular phone, a personal digital assistant (PDA), a digital camera, a portable game console, and an MP3 player, the flash memory devices may be more widely used as data storage and code storage. The flash memory devices may be used in home applications such as a high definition television (HDTV), a digital video disk (DVD), a router, and a Global Positioning System (GPS).

A computing system, according to example embodiments, may include a microprocessor that may be electrically connected with a bus, a user interface, a modem such as a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage to the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

While example embodiments have been particularly shown and described, it will be understood by those of ordinary skill in the art that various changes in form and details may be made therein without departing from the spirit and scope of example embodiments as defined by the following claims.

What is claimed is:

1. A memory device comprising:
a multi-bit cell array including a plurality of multi-bit cells;
a programming unit configured to program a first data page in the plurality of multi-bit cells and to program a second data page in the multi-bit cells with the programmed first data page;
a first controller configured to divide the multi-bit cells with the programmed first data page into a first group and a second group; and
a second controller configured to set a target threshold voltage interval of each of the multi-bit cells included in the first group based on first read voltage levels and the second data page, and to set a target threshold voltage interval of each of the multi-bit cells included in the second group based on second read threshold voltage levels and the second data page.

2. The memory device of claim 1, wherein the second controller compares the threshold voltage of each of the multi-bit cells of the first group with the first read voltage levels to generate threshold voltage state information of each of the multi-bit cells of the first group and sets the target threshold voltage interval of each of the multi-bit cells of the first group based on the threshold voltage state information and the second data page.

3. The memory device of claim 1, wherein the second controller compares the threshold voltage of each of the multi-bit cells of the second group with the second read voltage levels to generate threshold voltage state information of each of the multi-bit cells of the second group, and sets the target threshold voltage interval of each of the multi-bit cells of the second group based on the threshold voltage state information and the second data page.

4. The memory device of claim 1, wherein the programming unit programs the second data page to adjust the threshold voltage of each of the multi-bit cells with the programmed first data page to be included in the set target threshold voltage interval.

5. The memory device of claim 1, wherein the first controller sets the first group as multi-bit cells connected to a first word line and sets the second group as multi-bit cells connected to a second word line.

6. The memory device of claim 1, wherein the first controller sets the first group as multi-bit cells connected to an even bit line and sets the second group as multi-bit cells connected to an odd bit line.

7. The memory device of claim 1, wherein the first controller sets the first group as multi-bit cells with a number of erases less than a reference value and sets the second group as multi-bit cells with the number of erases greater than or equal to the reference value.

8. The memory device of claim 1, wherein the first controller, among the multi-bit cells with the programmed first data page, sets the first group as multi-bit cells with the first data page programmed in a first time slot and sets the second group as multi-bit cells with the second data page programmed in a second time slot.

9. The memory device of claim 1, wherein,
the programming unit applies a program voltage to a gate terminal of each of the multi-bit cells to program the first data page, and
the first controller sets the first group as multi-bit cells with a distance from the programming unit less than a reference value and sets the second group as multi-bit cells with the distance from the programming unit greater than or equal to the reference value.

10. The memory device of claim 1, wherein,
the first controller stores an error rate of each of the multi-bit cells with the programmed first data page and,
the first controller sets the first group as multi-bit cells with the stored error rate less than a reference value and sets the second group as multi-bit cells with the stored error rate greater than or equal to the reference value.

11. A memory programming method comprising:
programming a first data page in a plurality of multi-bit cells;
dividing the plurality of multi-bit cells into a first group and a second group;
setting a target threshold voltage interval of each of the multi-bit cells included in the first group based on first read voltage levels and a second data page;
setting a target threshold voltage interval of each of the multi-bit cells included in the second group based on second read voltage levels and the second data page; and
programming the second data page in the plurality of multi-bit cells.

12. The method of claim 11, wherein the setting of the target threshold voltage interval of each of the multi-bit cells included in the first group comprises:
- comparing the threshold voltage of each of the multi-bit cells of the first group with the first read voltage levels;
- generating threshold voltage state information of each of the multi-bit cells of the first group; and
- setting the target threshold voltage interval of each of the multi-bit cells of the first group based on the threshold voltage state information and the second data page.

13. The method of claim 11, wherein the setting of the target threshold voltage interval of each of the multi-bit cells included in the second group comprises:
- comparing the threshold voltage of each of the multi-bit cells of the second group with the second read voltage levels to generate threshold voltage state information of each of the multi-bit cells of the second group; and
- setting the target threshold voltage interval of each of the multi-bit cells of the second group based on the threshold voltage state information and the second data page.

14. The method of claim 11, wherein the programming of the second data page includes programming the second data page to adjust the threshold voltage of each of the multi-bit cells to be included in the set target threshold voltage interval.

15. The method of claim 11, wherein the dividing comprises:
- setting multi-bit cells connected to a first word line as the first group; and
- setting multi-bit cells connected to a second word line as the second group.

16. The method of claim 11, wherein the dividing comprises:
- setting multi-bit cells connected to an even bit line as the first group; and
- setting multi-bit cells connected to an odd bit line as the second group.

17. The method of claim 11, wherein the dividing comprises:
- setting multi-bit cells with a number of erases less than a reference value as the first group; and
- setting multi-bit cells with the number of erases greater than or equal to the reference value as the second group.

18. The method of claim 11, wherein the dividing comprises:
- setting multi-bit cells with the first data page programmed in a first time slot as the first group; and
- setting multi-bit cells with the first data page programmed in a second time slot as the second group.

19. The method of claim 11, wherein,
the programming of the first data page includes applying a program voltage to a gate terminal of each of the multi-bit cells using a voltage generating circuit to program the first data page, and
the dividing includes,
- setting multi-bit cells with a distance from the voltage generating circuit less than a reference value as the first group, and
- setting multi-bit cells with a distance from the voltage generating circuit greater than or equal to the reference value as the second group.

20. The method of claim 11, further comprising:
storing an error rate of each of the multi-bit cells,
wherein the dividing includes,
- setting multi-bit cells with the stored error rate less than a reference value as the first group, and
- setting multi-bit cells with the stored error rate greater than or equal to the reference value as the second group.

21. A computer-readable recording medium encoded with a computer program for implementing the method of claim 11.

* * * * *